United States Patent [19]

Shibata

[11] Patent Number: 5,697,072
[45] Date of Patent: Dec. 9, 1997

[54] TRANSMISSION SIGNAL LEVEL CONTROL DEVICE FOR RADIO TRANSMITTER

[75] Inventor: Takayuki Shibata, Tokyo, Japan

[73] Assignee: NEC Corporation, Tokyo, Japan

[21] Appl. No.: 603,386

[22] Filed: Feb. 20, 1996

Related U.S. Application Data

[63] Continuation of Ser. No. 20,371, Feb. 22, 1993, abandoned.

[30] Foreign Application Priority Data

Feb. 21, 1992 [JP] Japan .................................. 4-035324
Mar. 26, 1992 [JP] Japan .................................. 4-067800

[51] Int. Cl.[6] .................................................. H04B 1/04
[52] U.S. Cl. .................... 455/115; 455/126; 330/278; 375/295
[58] Field of Search ................................. 455/115, 126, 455/127, 116, 89, 56.1; 370/95.1, 95.3, 321, 337, 347; 375/296, 297, 295; 330/278, 279, 280, 281, 141

[56] References Cited

U.S. PATENT DOCUMENTS 4,992,753  2/1991  Jenson et al. ................... 455/126 X
5,121,391  6/1992  Paneth .......................... 455/33.1 X
5,193,223  3/1993  Walczak et al. ................. 455/127 X
5,241,690  8/1993  Larsson et al. ................. 455/116 X
5,287,555  2/1994  Wilson et al. ................... 330/278 X

*Primary Examiner*—Reinhard J. Eisenzopf
*Assistant Examiner*—Philip J. Sobutka
*Attorney, Agent, or Firm*—Foley & Lardner

[57] ABSTRACT

In order to realize control of a transmission signal level from a radio transmitter of TDMA (Time Division Multiplex System) with a simplified arrangement and with a high precision, a control circuit 9 outputs a transmission signal for each time slot and a level designation signal. A level control signal generator circuit 4 generates a level control signal in response to the level designation signal and outputs the level control signal through D/A converter 5 to a level control circuit 2. The level of the modulated transmission signal is controlled by the level control circuit 2 and is amplified by a RF amplifier circuit 3 thereby being output outside. The output level is detected by a detector circuit 8 and fedback through A/D converter 7 and a detection characteristic storage circuit 8 to level control signal generator circuit 4 so that the value of the level control signal is corrected.

6 Claims, 4 Drawing Sheets

TRANSMISSION SIGNAL LEVEL CONTROL DEVICE FOR RADIO TRANSMITTER

This application is a continuation of application Ser. No. 08/020,371, filed Feb. 22, 1993, now abandoned.

BACKGROUND OF THE INVENTION

1. Field of the Invention

The present invention relates to a transmission signal level control device for a radio transmitter, and more specifically to such a control device for controlling an output level of a base station transmitter in a mobile communication system in a TDMA (Time Division Multiplex Access) system.

2. Description of the Prior Art

Generally, a TDMA system is one multiplexing scheme with another being called frequency division multiplexing. These multiplexing schemes are employed for situations where one transmission passage is commonly used for data transmission from a plurality of terminals.

In a mobile communication system of such a TDMA system, a base station transmitter is required for changing a transmission level for each time slot, for permitting mobile station receivers located at various locations to receive a predetermined level signal. A prior art transmission signal level control device controls, as illustrated in FIG. 1, an output of a modulator circuit i with the aid of a level control circuit 2 in conformity with the voltage of a level control signal generated in a level control signal generator circuit 12 on the basis of a level designation signal. Since a rapid change in a signal level causes spreading of a transmission signal spectrum, the level control signal must be generated so as to smoothly change the signal level. For this, the level control signal generator circuit 12 is constructed as illustrated in FIG. 2A. More specifically, in a reference voltage generator circuit 12, a decoder 121 provides an output in conformity with an inputted level designation signal (comprising a plurality of bits) which output in turn changes over an analog switch 122 to alter a dividing ratio of a resistor 123 for alteration of output voltage (refer to Vd in FIG. 2B). The output is further smoothed through a low-pass filter (LPF) 125 (refer to FIG. 2C).

Further, in order to correct a transmission level which is altered owing to a change in a gain of an RF amplifier circuit 13 due to a temperature change and so on, it is necessary to control the gain of the RF amplifier circuit 13. Prior practice controls, as illustrated in FIG. 1, control the gain of the RF amplifier circuit 13 such that an input level of the RF amplifier circuit 13 after being detected by a first detector circuit 11 and amplified by a fraction corresponding to a predetermined gain of the RF amplifier circuit 13 becomes equal to an output level of the RF amplifier circuit 13 after being detected by a second detector circuit through comparison by a comparator circuit 10.

Further, in order to alter the transmission level so that a spectrum of the transmission signal is not spread, there is required, as the level control signal, such a smoothly changing waveform as illustrated in FIG. 4.

To achieve this, the reference voltage generator circuit 120 must generate many intermediate reference voltages other than the reference voltages illustrated in FIG. 2B. Variations of the resistances of the resistors 123 however impede realization of the reference voltage and the intermediate reference voltages with high precision.

Additionally, with a change in the transmission level the first and second detector circuits 11 and 8 suffer from a spread range of the level which must be detected thereby, so that detection characteristics of the first and second detector circuits 11 and 8 must be matched with each other over a wide level range. This requires a complicated adjusting circuit.

SUMMARY OF THE INVENTION

To solve the difficulties with the prior art, it is an object of the present invention to provide a transmission signal level control device for a radio transmitter in a TDMA system capable of realization of the control of a transmission signal accurately with a simplified construction.

To achieve the above object, a transmission signal level control device for a radio transmitter according to the present invention comprises: level control means for controlling a transmission signal level in response to a level control signal for each time slot of the transmission signal; signal level detector means for detecting the transmission signal level in a stationary state of a certain frame and a certain slot of the same; signal level determination means for comparing said detected transmission signal level of a certain frame and a certain slot of the same in a stationary state with a reference level designated by a level designation signal to obtain a transmission signal level of the next frame and said certain slot of the same in a stationary state; and control signal generator means for generating a level control signal serving to smoothly alter a transmission signal level from a stationary state of one slot to a stationary state of the next slot.

Further, in the foregoing arrangement, said level detector means comprises a detector circuit for detecting the output level from said RF amplifier circuit upon reception of said detection timing signal; an A/D converter circuit for A/D converting output voltage from the detector circuit; and a detection characteristic storage circuit for previously storing a corresponding relation between an output value from the A/D-convertor circuit and an output level from said RF amplifier circuit, and judging the output level of the RF amplifier circuit based upon the given output from the A/D converter circuit and outputting the judged output level as said transmission signal level signal.

BRIEF DESCRIPTION OF THE DRAWING

The above and other objects, features and advantages of the present invention will become more apparent from the following description when taken in conjunction with the accompanying drawings in which preferred embodiments of the present invention are shown by way of an illustrative example.

DETAILED DESCRIPTION OF PREFERRED EMBODIMENT

In the following, a preferred embodiment of the present invention will be described with reference to the accompanying drawings.

Figure 3:
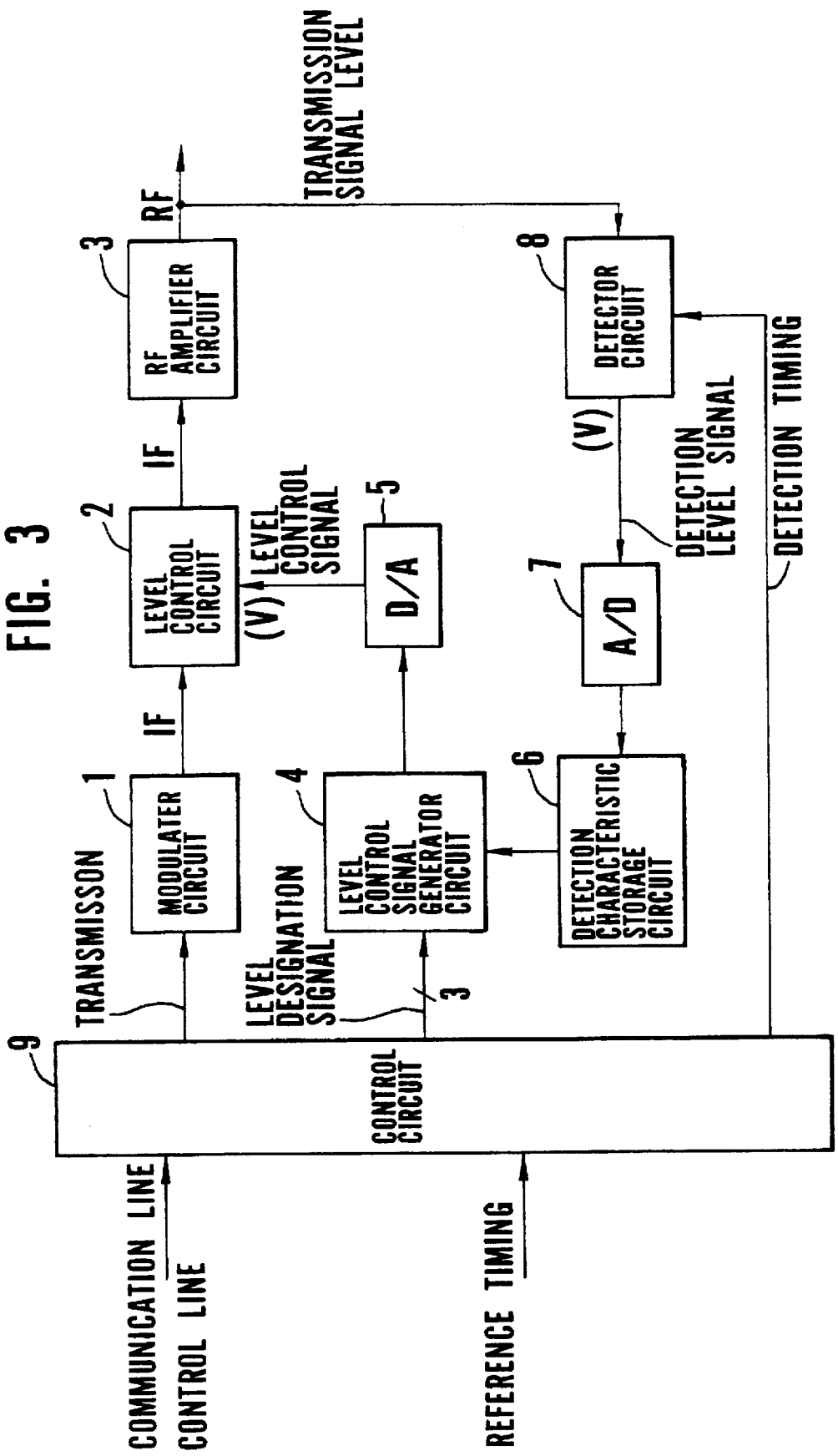
FIG. 3 is a block diagram illustrating an embodiment of the present invention.

Referring to FIG. 3, an embodiment of a transmission signal level control device according to the present invention is illustrated in the form of a block diagram.

Figure 1:
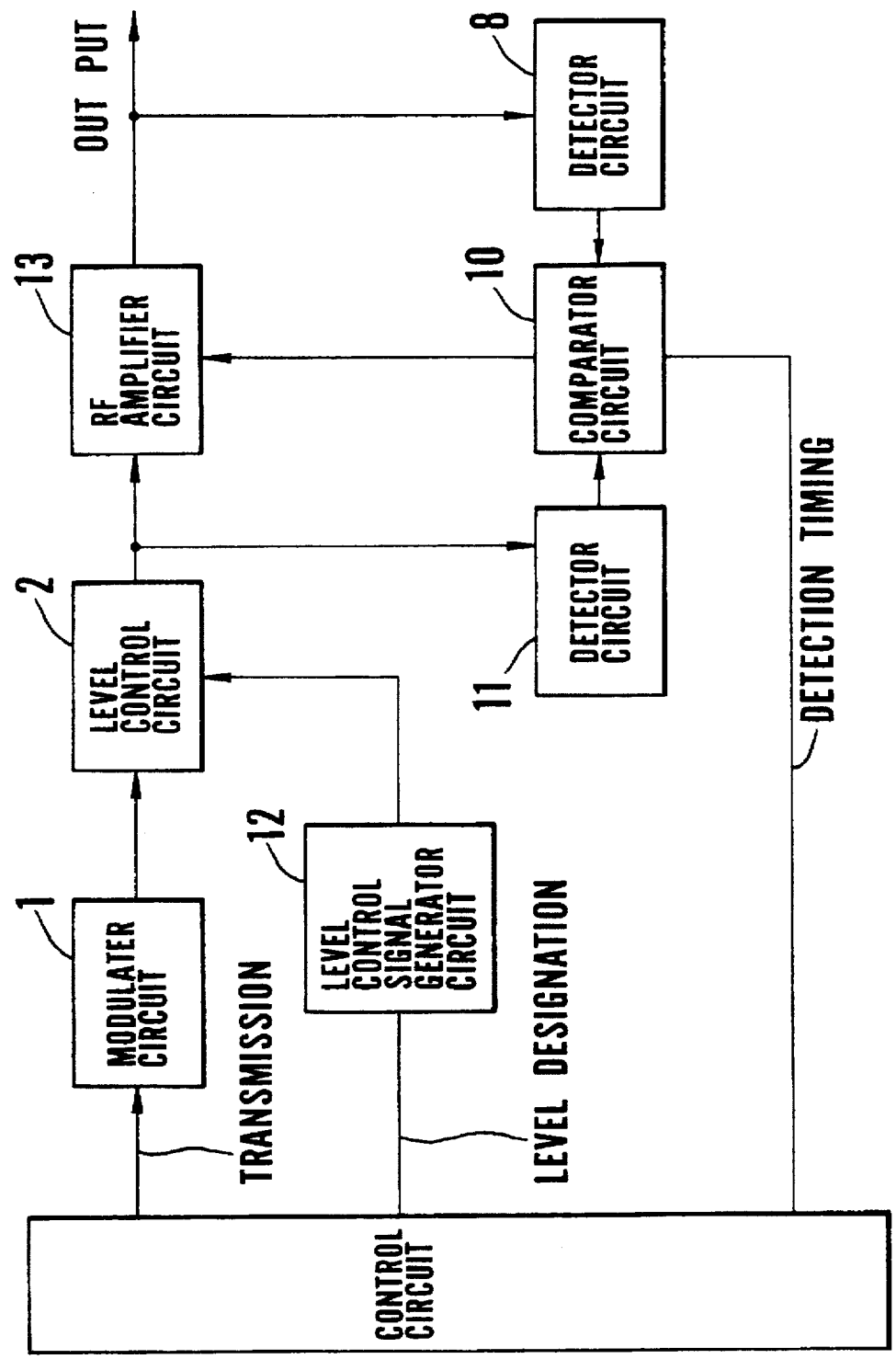
FIG. 1 is a block diagram illustrating a prior art transmission signal level controller.
Figure 2A:
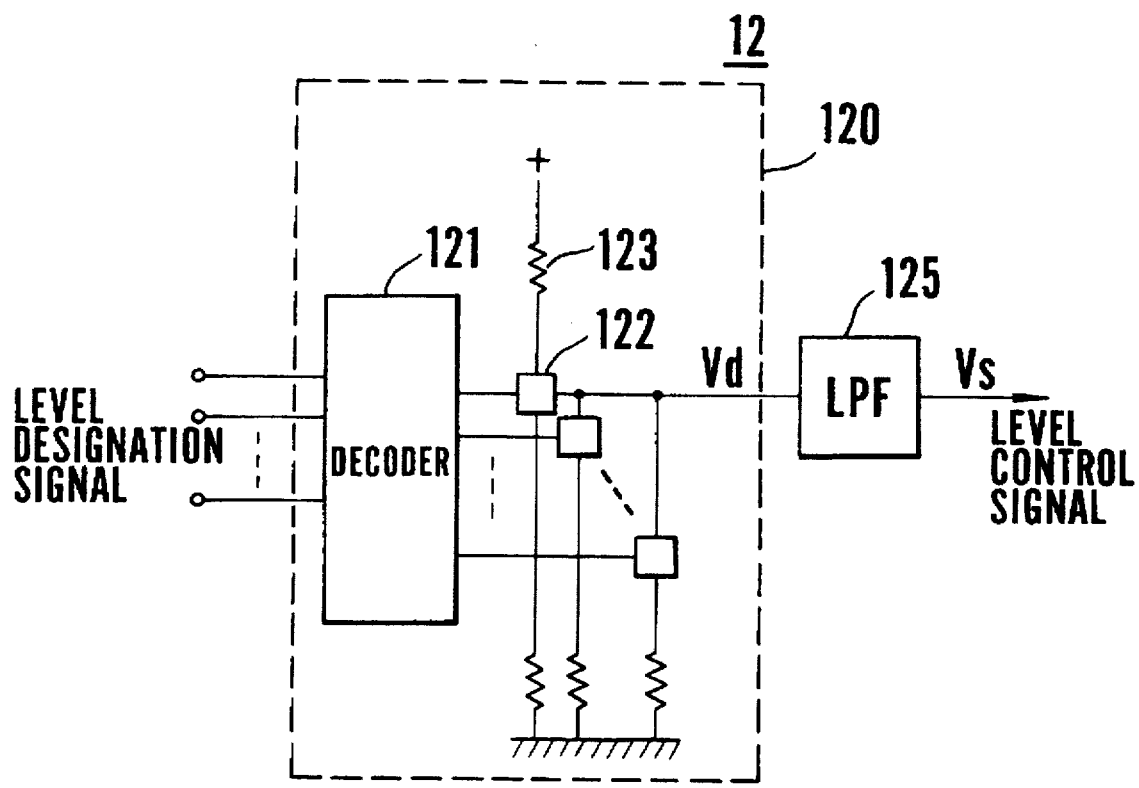
FIG. 2A is a block diagram illustrating a prior art level control signal generator circuit used in the controller shown in FIG. 1.
Figure 2B:
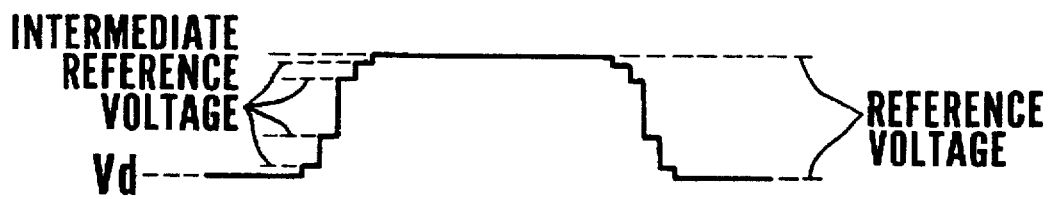
FIG. 2B illustrates an output waveform of a reference voltage generator circuit shown in FIG. 2A.
Figure 2C:
FIG. 2C illustrates an output waveform yielded after passage thereof through a low-pass filter.

The transmission signal level control device of the present embodiment comprises: a control circuit 9 for distributing a digital transmission signal including a control signal inputted through a transmission line for each time slot in conformity with a reference timing signal and issuing a 3 bit level designation signal and a detection timing signal; a modulator circuit 1 for rendering the foregoing transmission signal to digital phase modulation and outputting an IF transmission signal of a radio frequency; a level control circuit 2 for controlling an output level of the IF transmission signal in response to an analog level control signal; an RF amplifier circuit 3 for amplifying the level controlled IF transmission signal and outputting the same as an RF transmission signal; a detector circuit 8 for detecting the level of the RF transmission signal upon reception of the foregoing detection timing signal and outputting an analog detection level signal; an A/D converter circuit 7 for A/D-converting the detection level signal; a detection characteristic storage circuit 6 for previously storing a corresponding relation between the digital detection level signal and the RF transmission signal level, and judging the level of the RF transmission signal using a given detection level signal and outputting the same as a transmission signal level signal; a level control signal generator circuit 4 for correcting a transmission signal level signal based upon the level designation signal and issuing a digital level control signal; and a D/A converter circuit 5 for D/A-converting the level control signal. D/A converter circuit 5 may be constructed such that an analog switch is changed over to alter a dividing ratio of resistance as in the prior art reference voltage generator circuit 120 illustrated in FIG. 2A.

The output from the RF amplifier circuit 3 is synthesized with other outputs from other RF amplifier circuits (not shown) as a carrier, and is transmitted through a power amplifier and a transmission antenna (both not shown).

Operation of the embodiment is as follows.

Figure 4:
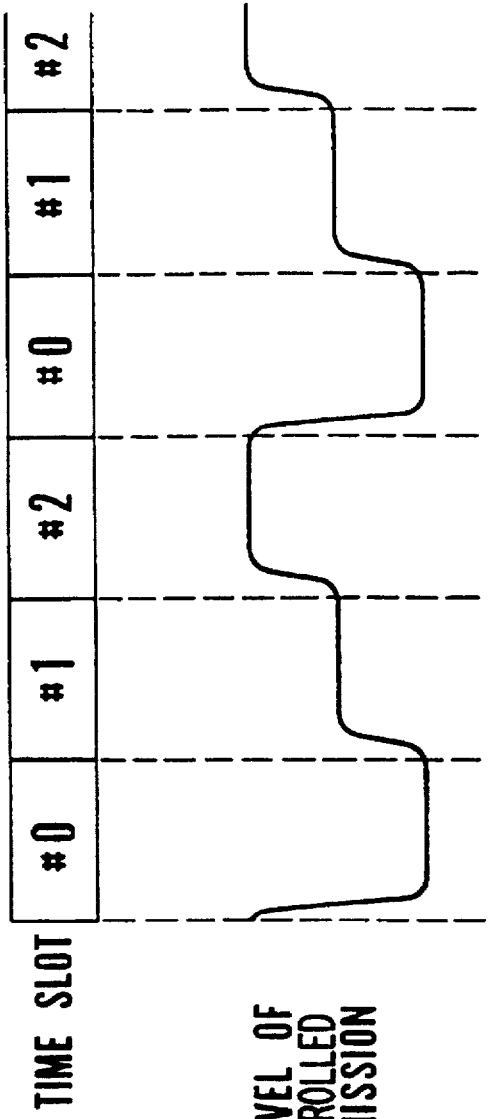
FIG. 4 is a view illustrating an exemplary level control signal waveform.
Figure 5:
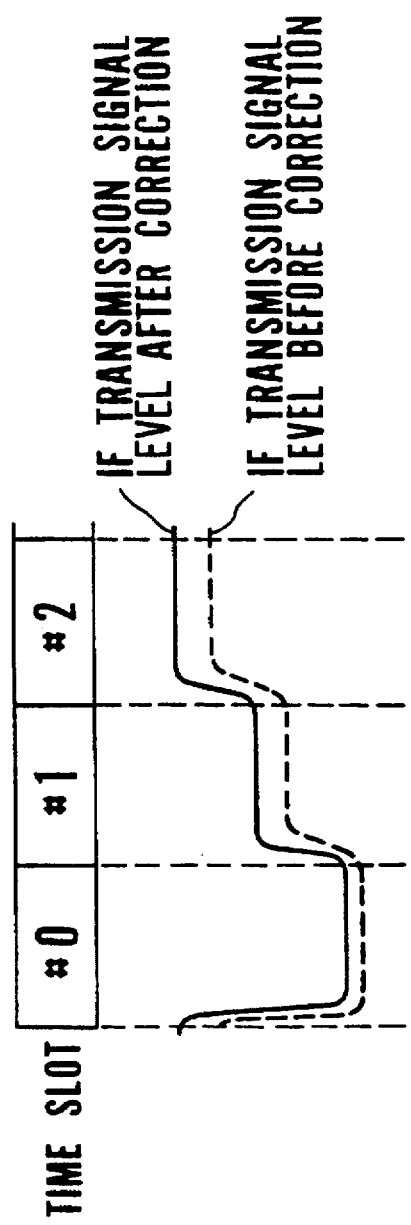
FIG. 5 is a view illustrating an exemplary corrected level control signal waveform.

The level control signal generator circuit 4 possesses a computation function and generates a digital level control signal, which successively changes, up to a predetermined value, through a computation based upon the level designation signal for each time slot. The generated digital level control signal is D/A-converted by the D/A converter circuit 5 and fed to the level control circuit 2 to control the output signal (IF transmission signal) level from the modulator circuit 1 to produce the level controlled IF transmission signal, as illustrated in FIG. 4. Further, the output level from the RF amplifier circuit 3, i.e., the RF transmission signal level is detected by the detector circuit 8 in accordance with the detection timing and an output from the detector circuit 8 is A/D-converted by the A/D converter circuit 7 and is inputted to the detection characteristic storage circuit 6. The detection characteristic storage circuit 6 stores detection characteristics of the detector circuit 8 and determines a transmission signal level on the basis of the output from the A/D converter circuit 7. A judgement result, i.e. a transmission signal level signal is inputted to the level control signal generator circuit from the detection characteristic storage circuit 6. The level control signal generator circuit 4 compares an output signal level with a detection level of the transmission signal level signal, and provided there is any difference therebetween, the level control signal is corrected and outputted. Referring to FIG. 5, the level control signal in this occasion is illustrated.

In accordance with the present invention, as described above, the level control signal generator means, which generates the analog level control signal from the digital level control signal, is fed-back with a device output signal and outputs a corrected level control signal. Thus, the present invention is not affected by variations of analog elements and does not require a complicated adjusting circuit for adjusting outputs from two different detector circuits, unlike the prior art circuits, and ensures a transmission signal level control device with a simplified construction but with highly accurate transmission level control.

What is claimed is:

1. A transmission signal level control device comprising:
level control means for controlling a transmission signal level in response to a level control signal for each time slot of a transmission signal;

signal level detector means for detecting the transmission signal level in a stationary state of a certain slot of a certain frame; and level control signal generator means for comparing said detected transmission signal level with a reference level designated by a level designation signal and generating a level control signal for a next slot of said certain frame to smoothly alter the transmission signal level from a stationary state of one slot of a frame to a stationary state of the next slot of the frame based on any difference between said detected transmission signal level and said reference level.

2. A transmission signal level control device according to claim 1 wherein said signal level detector means comprises:
a detector circuit for outputting a voltage corresponding to said transmission signal level after RF amplification of the transmission signal upon reception of a detection timing signal by said detector circuit;

an A/D converter circuit for converting the output voltage from said detector circuit into a corresponding digital signal; and a detection characteristic storage circuit for determining a transmission signal level based on the digital signal.

3. A transmission signal level control device according to claim 1 wherein said level control means comprises a level control circuit for controlling a transmission signal level in response to a level control signal for each time slot of the transmission signal.

4. A transmission signal level control device according to claim 1 wherein said level control signal generator means computes a waveform for altering a transmission signal level between the certain slot and the next slot using, as parameters, the detected transmission signal level of said certain slot and the level designation signal of said next slot and provides said waveform as a waveform of said level control signal.

5. A transmission signal level control device comprising:
a control circuit for distributing a digital transmission signal and issuing a level designation signal and a detection timing signal for each time slot of said digital transmission signal;

a modulator circuit for carrying out digital phase modulation on said digital transmission signal to produce an IF transmission signal;

a level control circuit for controlling a transmission signal level of said IF transmission signal in response to a level control signal to produce a level-controlled IF transmission signal;

an RF amplifier circuit for amplifying said level-controlled IF transmission signal to produce an amplified RF transmission signal;

a detector circuit for detecting a transmission signal level of said amplified RF transmission signal upon reception of said detection timing signal from said control circuit;

a detection characteristic storage circuit for determining a digital detection level corresponding to the transmission signal level of said amplified RF transmission signal; and a level control signal generator circuit for comparing said digital detection level with a level designation signal for a subsequent time slot of said digital transmission signal and generating a level control signal for the subsequent time slot based on a difference between said digital detection level and said level designation signal for the subsequent time slot.

6. A method of controlling a transmission signal level comprising the steps of:

distributing a digital transmission signal and issuing a level designation signal and a detection timing signal for each time slot of said digital transmission signal;

carrying out digital phase modulation on said digital transmission signal to produce an IF transmission signal;

controlling a transmission signal level of said IF transmission signal in response to a level control signal to produce a level-controlled IF transmission signal;

amplifying said level-controlled IF transmission signal to produce an amplified RF transmission signal;

detecting a transmission signal level of said amplified RF transmission signal upon reception of said detection timing signal from said control circuit;

determining a digital detection level corresponding to the transmission signal level of said amplified RF transmission signal; and comparing said digital detection level with a level designation signal for a subsequent time slot of said digital transmission signal and generating a level control signal for the subsequent time slot based on a difference between said digital detection level and said level designation signal for the subsequent time slot.

\* \* \* \* \*